US007343255B2

(12) United States Patent
Osterloh et al.

(10) Patent No.: US 7,343,255 B2
(45) Date of Patent: Mar. 11, 2008

(54) DUAL SOURCE REAL TIME CLOCK SYNCHRONIZATION SYSTEM AND METHOD

(75) Inventors: Christopher L. Osterloh, Waseca, MN (US); Christopher J. Nagy, Waseca, MN (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 11/176,937

(22) Filed: Jul. 7, 2005

(65) Prior Publication Data

US 2006/0009927 A1 Jan. 12, 2006

Related U.S. Application Data

(60) Provisional application No. 60/585,868, filed on Jul. 7, 2004.

(51) Int. Cl.
*G01R 21/00* (2006.01)

(52) U.S. Cl. ............................ 702/62; 702/61; 702/79; 702/178; 702/187; 340/870.11

(58) Field of Classification Search ............ 702/60–62, 702/57, 64, 65, 79, 106, 107, 125, 122, 187, 702/176, 178, 189
See application file for complete search history.

(56) References Cited

U.S. PATENT DOCUMENTS 4,050,020 A 9/1977 Germer et al. .............. 324/116
4,166,975 A 9/1979 Germer et al. .............. 324/116
4,337,463 A 6/1982 Vangen .................... 340/825.2
4,455,453 A 6/1984 Parasekvakos et al. 379/106.06
4,663,587 A 5/1987 Mackenzie .................. 324/141
4,754,217 A 6/1988 Germer et al. .............. 324/116
4,876,700 A 10/1989 Grindahl ..................... 375/333
4,881,070 A 11/1989 Burrowes et al.
5,027,297 A 6/1991 Garitty et al. .............. 702/187
5,216,357 A * 6/1993 Coppola et al. ............ 324/142
5,239,575 A 8/1993 White et al. ........... 379/106.06
5,341,403 A 8/1994 Morley ....................... 375/354
5,377,232 A 12/1994 Davidor et al. ............. 375/354
5,469,153 A 11/1995 Atherton et al. ....... 340/870.28
5,469,467 A 11/1995 Vella-Coleiro
5,712,867 A 1/1998 Yokev et al. ............... 375/136
5,897,607 A * 4/1999 Jenney et al. ................. 702/62
5,923,269 A * 7/1999 Shuey et al. ........... 340/870.02
5,994,892 A 11/1999 Turino et al. ............... 324/142
5,995,022 A 11/1999 Plis et al. .............. 340/870.02
6,172,616 B1 1/2001 Johnson et al. ........ 340/870.12

(Continued)

FOREIGN PATENT DOCUMENTS

WO WO 2004/032327 4/2004

*Primary Examiner*—Hal Wachsman
(74) *Attorney, Agent, or Firm*—Patterson, Thuente, Skaar & Christensen, P.A.

(57) ABSTRACT

A dual source real time clock (RTC) synchronization system and method for implementation within automatic meter reading (AMR) systems that provide system-wide device time synchronization. In one embodiment, a microcontroller-implemented RTC counts elapsed seconds from a predetermined system timestamp using a low-speed, low-accuracy crystal. A second source is used to compensate for the low-speed, low-accuracy crystal. This second source comprises a high speed clock in one embodiment. This dual source RTC system can synchronize the endpoint device.

21 Claims, 3 Drawing Sheets

U.S. PATENT DOCUMENTS

| | | | | |
|---|---|---|---|---|
| 6,181,257 | B1 * | 1/2001 | Meek et al. | 340/870.01 |
| 6,208,871 | B1 | 3/2001 | Hall et al. | |
| 6,351,223 | B1 | 2/2002 | DeWeerd et al. | 340/870.03 |
| 6,429,785 | B1 | 8/2002 | Griffin et al. | 340/870.02 |
| 6,639,957 | B2 | 10/2003 | Cahill-O'Brien et al. | 375/354 |
| 6,728,646 | B2 | 4/2004 | Howell et al. | 702/62 |
| 6,829,229 | B1 | 12/2004 | Palermo et al. | |
| 6,931,087 | B1 | 8/2005 | Karol | 375/376 |
| 2002/0082748 | A1 | 6/2002 | Enga et al. | |
| 2002/0145537 | A1 | 10/2002 | Mueller et al. | |
| 2005/0068194 | A1 * | 3/2005 | Schleich et al. | 340/870.02 |

* cited by examiner

DUAL SOURCE REAL TIME CLOCK SYNCHRONIZATION SYSTEM AND METHOD

RELATED APPLICATION

This application claims priority to U.S. Provisional Patent Application Ser. No. 60/585,868, filed Jul. 7, 2004, which is incorporated herein by reference.

FIELD OF THE INVENTION

The invention relates generally to radio frequency (RF) communications in automatic meter reading (AMR) systems, and more particularly to clock synchronization among devices within AMR systems.

BACKGROUND OF THE INVENTION

Automatic meter reading (AMR) systems are generally known in the art. Utility companies, for example, use AMR systems to read and monitor customer meters remotely, typically using radio frequency (RF) communications in fixed or mobile implementations. AMR systems are favored by utility companies and others who use them because they increase the efficiency and accuracy of collecting readings and managing customer billing. For example, utilizing an AMR system for the monthly reading of residential gas, electric, or water meters eliminates the need for a utility employee to physically enter each residence or business where a meter is located to transcribe a meter reading by hand.

There are several different ways in which current AMR systems are configured. In a fixed network, endpoint devices at meter locations communicate with readers that collect readings and data using RF communication. There may be multiple fixed intermediate readers, or relays, located throughout a larger geographic area on utility poles, for example, with each endpoint device associated with a particular reader and each reader in turn communicating with a central system. Other fixed systems utilize only one central reader with which all endpoint devices communicate. In a mobile environment, a handheld or otherwise mobile reader with RF communication capabilities is used to collect data from endpoint devices as the mobile reader is moved from place to place.

AMR systems generally include one-way, one-and-a-half-way, or two-way communications capabilities. In a one-way system, an endpoint device periodically turns on, or "bubbles up," to send data to a receiver. One-and-a-half-way AMR systems include receivers that send wake-up signals to endpoint devices that in turn respond with readings. Two-way systems enable command and control between the endpoint device and a receiver/transmitter.

While conventional fixed networks provide many advantages over manual read meters, they are limited by the power consumption and battery life of the individual meters. Configuring the meters to respond to or initiate communications with a central device is a drain on the battery life of the meters. The meters still require frequent manual servicing to change out batteries, defeating the most significant advantage of a fixed network system.

Battery life can be conserved by programming the meter devices to bubble-up only at particular times or during specific intervals to communicate with a central device. To accomplish this, meter devices include a timing device, clock, or microprocessor-implemented real time clock (RTC) in order to maintain synchronization with the central device and system as a whole and bubble-up or communicate with the system at the desired times.

By way of example, U.S. Pat. No. 4,455,453 relates to remote sensor monitoring, metering, and control. A remote unit includes a central control and processing unit. Clock pulses from a timing network increment real time clock logic within the central control and processing unit. When the real time indication matches the preset desired callback time, the remote unit initiates a telephone call to a central complex. The central complex responds by transmitting back to the remote unit an acknowledgement signal in the form of a synchronization pulse sequence. Upon detection of the synchronization signal, the central control and processing unit effects data transmission. The central complex receives the transmission and analyzes an error code. If the error code is found, the central complex replies with an instruction transmission comprising a leading sync signal, a code indicative of the next desired callback time, and a code indicative of the instantaneous real time for resetting the real time register.

While the system described in U.S. Pat. No. 4,455,453 provides for individual remote unit synchronization, the remote unit will be limited by battery power. Synchronization schemes requiring multiple data exchanges will significantly deplete a battery power source and are thus not generally desirable in battery-powered systems with a plurality of remote units with which to communicate and maintain because of battery and service cost considerations.

A system for periodically communicating data acquired by a remote data unit over a dial-up telephone line to a central computer is disclosed in U.S. Pat. No. 5,239,575. The remote data unit includes a real-time clock that maintains the local time.

U.S. Pat. Nos. 6,351,223 and 6,728,646 also disclose systems that include real time clocks. U.S. Pat. No. 6,351,223, in particular, discloses periodically powering down a microcontroller to ensure a longer life for the battery used in the transmitter.

U.S. Pat. No. 5,994,892, which is directed to an automatic utility meter, includes a real time clock that provides time and date from 1/100th of a second to years. The microcontroller accesses the real time clock at programmable intervals for functions requiring time and date, including time/date to upload data to a central computer.

Using real time clocks within meter devices, however, are a further drain on the battery life of the device because they must operate with a high degree of precision, which in turn requires high current consumption. High-precision RTCs are also relatively high-cost, adding to the overall cost of the individual meter device if included in each device and working against the desired cost-effectiveness of AMR systems.

There is, therefore, a need in the industry for an AMR system that addresses the meter device battery life shortcomings associated with conventional fixed network AMR systems while providing cost-effective meter devices capable of maintaining time synchronization.

SUMMARY OF THE INVENTION

The invention disclosed herein substantially meets the aforementioned needs of the industry. In particular, a dual source real time clock (RTC) synchronization system and method are disclosed for implementation within automatic meter reading (AMR) systems that provide system-wide device time synchronization while minimizing power consumption by battery-powered devices.

The invention includes a method of synchronizing an endpoint device adapted for radio frequency (RF) communications in an automatic meter reading (AMR) system. According to one embodiment of the method, elapsed time is counted from a system timestamp by a first clock through a plurality of count cycles having a fixed count value. Elapsed time is counted by a second clock through a subsequent count cycle having a fixed count value, wherein an accuracy of the second clock is higher than an accuracy of the first clock. An overflow count and an offset count are determined based on a maximum count value of the second clock, wherein the overflow count is a number of times the maximum count value of the second clock is realized and the offset count is a number of counts reached after the last maximum count value, and a count value of a final count cycle from the offset count is calculated. A synchronization error of the first clock is then compensated for by adjusting the final count cycle from a nominal default count value to the calculated count value, and the first clock as compensated for the synchronization error is used as the source of the clocking signals for the endpoint device in the AMR system.

The invention also includes a utility meter endpoint device adapted for a radio frequency (RF) communication automatic meter reading (AMR) system. In one embodiment, the endpoint device comprises a communications unit and a microcontroller. The communication unit is operatively coupled to a utility meter and comprises communications circuitry adapted for periodic RF communications with a reader. The microcontroller comprises a real time clock (RTC) and a counter and electrically coupled to the power source and the communications circuitry, and the RTC comprises a first oscillator and the counter comprising a second oscillator. The second oscillator preferably has a higher accuracy than the first oscillator. The microcontroller is operable to calculate an adjustable final count cycle based on the counter and the second oscillator after a plurality of fixed count cycles during a periodic RF communication and use the calculated adjustable final count cycle to compensate the RTC and maintain synchronization at an accuracy better than an accuracy of the first oscillator. The invention is also directed to a synchronization system adapted for a radio frequency (RF) communication device in an automatic meter reading system.

The above summary of the invention is not intended to describe each illustrated embodiment or every implementation of the invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
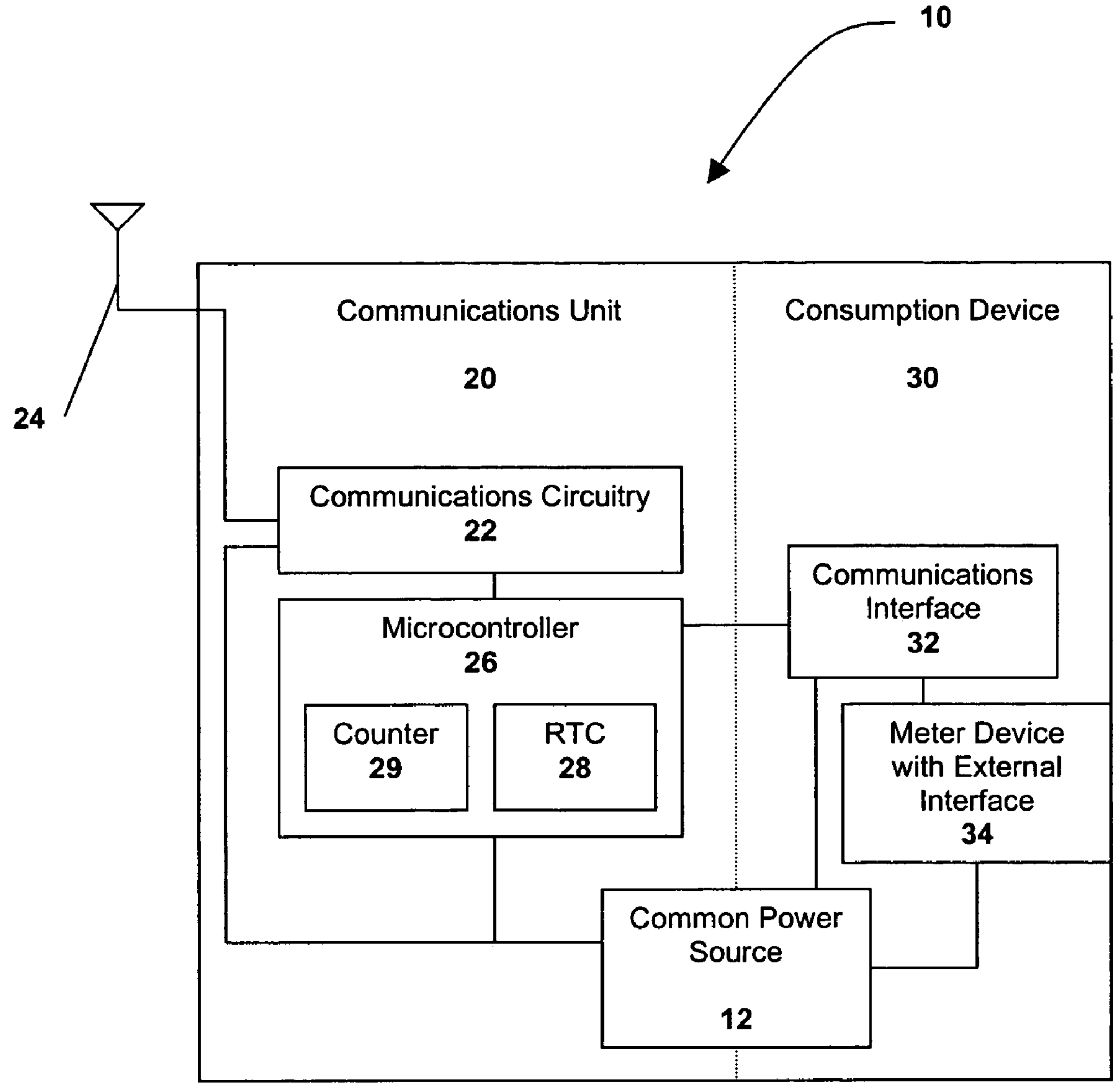
FIG. 1 is a block diagram of an endpoint device according to one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

Various embodiments of the dual source real time clock synchronization system and method of the invention provide a more inexpensive periodic synchronization of meter device endpoints operating within AMR systems while minimizing device battery consumption. The invention can be more readily understood by reference to FIGS. 1 and 2 and the following description. While the invention is not necessarily limited to such an application, the invention will be better appreciated using a discussion of example embodiments in such a context.

One embodiment of the dual source RTC synchronization system is implemented in a fixed AMR system, which provides RTC functionality and synchronization in fixed AMR system endpoint devices with low drift. Other embodiments of the dual source RTC synchronization system are implemented in mobile and handheld AMR systems. In these AMR system implementations, the RTC synchronization system provides RTC functionality and synchronization in the AMR system endpoint devices with less than about two minutes per month error.

Various embodiments of the dual source RTC synchronization system and method provide differing levels of time-related operations. In one embodiment, endpoint devices including RTCs in accordance with the invention are capable of timed operations, for example interval data reporting and day take results. In other AMR system embodiments, endpoint devices support only bubble-up rates and meter read rates.

In system embodiments including endpoint devices capable of timed operations, each endpoint device includes a microcontroller operable to perform the RTC operations. The microcontroller-implemented RTC counts elapsed seconds from a pre-determined system timestamp using a low-speed, low-accuracy crystal. To maintain accurate time and synchronization, a second source is used to compensate for the low-speed, low-accuracy crystal. This second source comprises a high speed, high-accuracy clock in one embodiment. This dual source RTC system synchronizes the endpoint device to within one second of an external reference time signal. Time during communications, thereby providing a relatively low-cost, reduced power consumption synchronization system and method. Such improved synchronization reduces potential conflicts and collisions in RF communications and increases the accuracy of data and consumption interval logging.

AMR systems are typically implemented in geographic areas of varying but relatively high densities, for example urban and suburban communities and commercial zones, and are associated most often with utility meters and other consumption devices monitored or read periodically. An exemplary AMR system comprises a central device, for example a central utility station, and a plurality of geographically distributed and communicatively tiered endpoint and transceiver devices. Here and throughout this application the term "endpoint device" will be used to generally refer to a radio frequency (RE) communications unit or transceiver and a consumption meter or similar device operating in conjunction with and as one remote device, even though in some embodiments the meter and transceiver can be distinct devices, with a reader communicating with the wireless communications unit and the communications unit in turn communicating with the actual meter using RE or some other communications format known to those skilled in the art.

The plurality of endpoint devices in a larger geographic area can be subdivided into a plurality of cells, with each cell having its own intermediary central device that communicates data and information between each of the plurality of endpoint devices and the central utility. In other embodiments, the central utility device communicates directly with the endpoint devices within a particular radius and "hops" communications to devices that are farther away using intermediate repeater devices. In addition to fixed network AMR system installations, the plurality of endpoint devices can also be read by handheld or mobile reader devices instead of or in addition to the fixed devices previously described. Other system configurations and communications means will also be recognized by those skilled in the art.

Endpoint devices in AMP. systems such as those just described generally rely on battery power for communications between the meter and the communications unit, and between the communications unit and a central device or utility. Refer, for example, to U.S. Pat. Nos. 4,455,453; 5,239,575; 6,351,223; 6,728,646; and 5,994,892, which are incorporated herein by reference. To keep costs low, long-life batteries are desired, reducing the need to physically service the geographically distributed devices to replace spent batteries while increasing the reliability of the endpoint devices. In AMR systems in which relative time synchronization is required for accurate communications between at least one endpoint device and a central device or utility, the battery will also power the synchronization circuitry.

Various embodiments of the dual source RTC synchronization system of the present invention are therefore implemented in one or more of the AIVIR system formats described above. The system of the invention provides RTC functionality and synchronization in AMR system endpoint devices operating in a variety of AMR system architectures and configurations, such as handheld, mobile, fixed, and combinations thereof in which some or all system devices are compatible with one or more of the architectures and configurations. In example handheld and mobile embodiments, the system and method of the invention provide RTC functionality and synchronization with less than about two minutes per month error, equivalent to about 46 ppm. In one example fixed network embodiment, the system and method of the invention provide RTC functionality and synchronization with less than about ten milliseconds (ms) per approximately five-minute period of drift, equivalent to about 33 ppm. Other desired error and drift levels can be realized in other embodiments of the invention, as described in more detail below, the particular values given above indicative only of example embodiments.

Accordingly, various embodiments of the dual source RTC synchronization system can provide differing levels of time-related operations. In one embodiment, endpoint devices including RTCs in accordance with the invention are capable of timed operations, for example interval data reporting and day take results. In other AMR system embodiments, endpoint devices support only bubble-up rates and meter read rates.

Referring to FIG. 1, an endpoint device 10 according to one embodiment of the invention described herein includes a communications unit 20 in operable communication with a consumption device 30. As previously discussed, communications unit 20 and consumption device 30 can be implemented as a combined unit in a single housing, or can be distinct devices electrically interconnected to operate substantially as described herein. Communications unit 20 generally comprises communications circuitry 22 and an antenna 24 to enable RF communications with a central device. Consumption device 30 typically includes a meter device 34 having an external interface to monitor consumption, for example household electricity, gas, or water consumption. Communications unit 20 and consumption device 30 can share a common power source 12 or be provided with individual power sources.

In systems including endpoint devices capable of timed operations, each endpoint device 10 includes a microcontroller 26 operable to perform the RTC operations. In one example embodiment described herein, the microcontroller is a TI MSP430F135/F147, manufactured by TEXAS INSTRUMENTS. The microcontroller-implemented RTC 28 counts elapsed seconds from a pre-determined system timestamp using a low-speed, low-accuracy crystal. In one embodiment, the crystal speed is about 32.768 kiloHertz (kHz) and the accuracy is plus or minus about 220 ppm.

As is understood by those skilled in the art, other microcontrollers and/or crystals can be used in other embodiments of the invention. One embodiment of the invention comprising the aforementioned microcontroller and other devices will be described herein as one non-limiting example, with related and sometimes preferred values, standards, tolerances, timing, and desired characteristics and results described in the context of the example embodiment. The particular values, standards, and desired characteristics are indicative of only one of many embodiments and are in no way intended to restrict the claimed invention.

To maintain accurate time and synchronization, a second counter source 29 is used to compensate for the low-speed, low-accuracy crystal in the RTC 28. Counter 29 preferably comprises a high speed, high-accuracy clock. In one embodiment, counter 29 has a speed of about 8 Mhz and an accuracy of plus or minus about 20 ppm. This dual source (28, 29) RTC system synchronizes endpoint device 10 to an external reference time signal, plus or minus about one second in one embodiment, during communications as described in more detail below.

Figure 2:
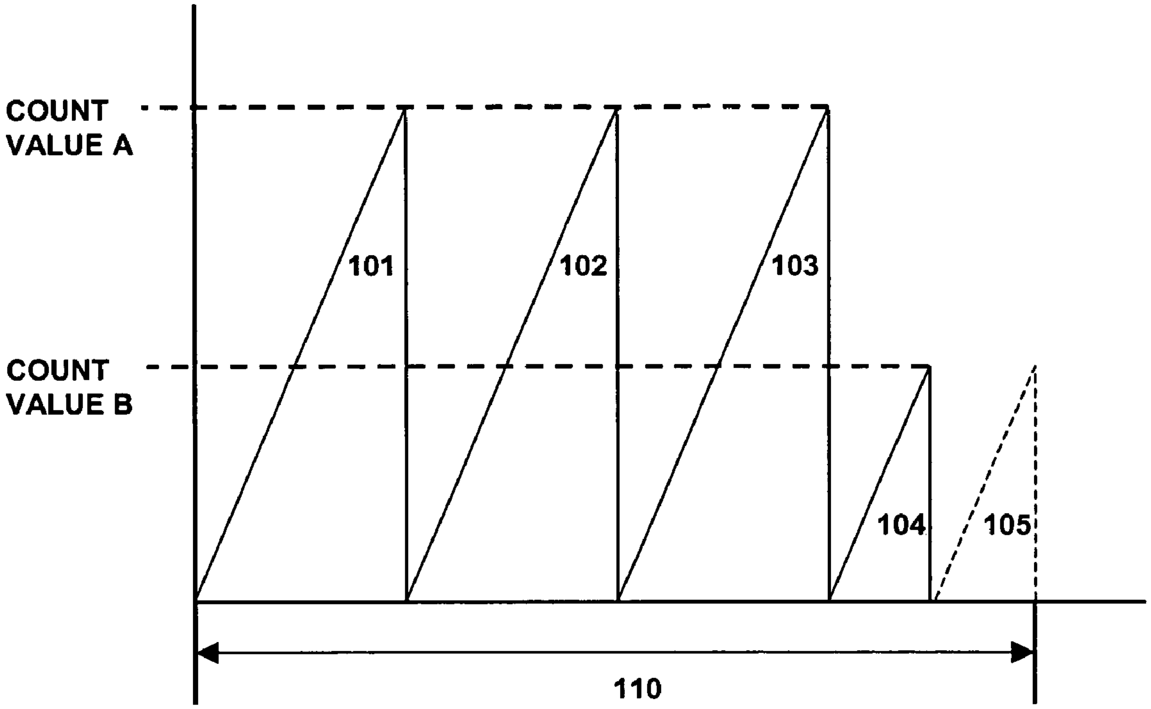
FIG. 2 is a count cycle diagram according to one embodiment of the invention.

FIG. 2 is a count cycle diagram according to one embodiment of the invention, in which microcontroller 26 operates as a counter. Microcontroller 26 operates off a low-accuracy crystal, such as the 32.768 kHz crystal described above, to create a nominal count rate of 32,768 counts per second in one embodiment. Microcontroller 26, via RTC 28, counts through five cycles 101, 102, 103, 104, and 105, wherein the first three count cycles 101, 102, and 103 are fixed at a first count rate A. In one embodiment, count value A is 32,768 counts per cycle. A fourth cycle 104 is fixed at a second count value B, 16,384 counts in one embodiment, or half of each of the first three count cycles 101, 102, and 103. A fifth cycle 105 has a nominal value of 16,384 counts, or count value B, but is adjustable for compensation purposes to achieve a desired or required granularity error. In one embodiment, the error is about 7.63 ppm, or $1/131072$. The five count cycles 101, 102, 103, 104, and 105 are completed in a period 110 of four seconds in one embodiment, although the period and the count cycles can be longer or shorter or otherwise vary in other embodiments.

According to the dual source synchronization system and method of the invention, RTC 28 operating off the low-accuracy crystal is periodically compensated based upon a high-speed, high-accuracy clock source used by communications circuitry 22 described above in order to improve the error tolerance of RTC 28. In one embodiment, the error tolerance of about 220 ppm described above can be improved to about 50 ppm or below, bringing RTC 28 to within plus or minus about 8.5 ppm of the high-speed oscillator. Error budgets for one embodiment of each of a mobile/handheld and fixed network implementation of the invention are shown below in TABLE 1.

TABLE 1

| APPLICATION | ERROR | PPM (Approximate, plus or minus) |
|---|---|---|
| MOBILE/ HANDHELD | High-speed oscillator error | 20 |
| | Compensated low-speed oscillator error | 8.5 |
| | Synchronization to External Reference Time Signal Error | 0.5 |
| | Low-speed oscillator drift | 17 |
| | TOTAL: | ±46 ppm |
| FIXED NETWORK | High-speed oscillator error | 20 |
| | Compensated low-speed oscillator error | 8.5 |
| | Synchronization to External Reference Time Signal Error | N/A |
| | Low-speed oscillator drift | 4.5 |
| | TOTAL: | ±33 ppm |

High-speed oscillator error is defined as the error between the high-speed oscillator and an external reference time signal. The external reference time signal can be a system-established reference time signal or an independent reference time signal, such as a signal received, derived, or translated from a time signal broadcast by the National Institute of Standards and Technology (NIST). For example, the external reference time signal can be received and calculated from "Universal Time," UTC or Greenwich Mean Time, or can be a previously derived local time signal received. Low-speed oscillator error is defined as the error between the low-speed oscillator and the high-speed oscillator. The synchronization to the external reference time signal is one second per monthly read in one mobile/handheld embodiment, which is less than the budgeted 0.5 ppm described above. In a fixed network embodiment, the timing standard is based on the ability of endpoint device 10 to accurately time the difference between two events, thus the external reference time signal is not relevant. The low-speed oscillator drift is primarily a function of the frequency of compensation, where the compensation can be performed often enough to meet plus or minus about 17 ppm value in mobile/handheld embodiments. In one fixed network embodiment, the plus or minus about 4.5 ppm drift value is budgeted for a five-minute time window during a network read. When the network is not being read, the mobile/handheld values apply.

The dual source method of the invention uses the high-speed clock to compensate low-speed RTC 28. In one embodiment, a second counter or timer 29 implemented in microprocessor 26 of endpoint device 10 runs at about 8 MHz for about one-half second, as defined by the low-speed clock of RTC 28. Any required compensation for the low-speed clock is then determined based on the number of counts registered by high-speed counter 29.

Referring again to FIG. 2, this synchronization is performed in fourth count cycle 104 in one embodiment. Fourth count cycle 104 is fixed at count value B of 16,384 counts, during which time high-speed counter 29 should count to 4,000,000, plus or minus 1,800 counts or 450 ppm. Counter 29 in microprocessor 26 of each endpoint device 10 is a counter having a maximum value of 32,767 in one embodiment. For 4,000,000, plus or minus 1,800 counts, 20 counter 29 will overflow 122 times, with an offset value of 2,304 plus or minus 1,800 counts remaining. In situations in which the overflow count is incorrect or the offset value is outside of the designated range, compensation can be attempted again.

In the normal case in which the overflow count is correct, a variable n is computed using the offset value, where n is the variable fifth cycle 105 count value. The equation for computing n based upon the offset of second counter 29 is as follows:

$$n = \frac{16\times 10^6}{122 + (\text{offset}/32768)} - 114{,}688 \quad \text{Equation 1}$$

Equation 1 will preferably produce theoretically ideal values for n, but as will be understood by those skilled in the art these values are difficult to implement in small microcontrollers 26 because of the need for floating point division and other factors. To overcome these limitations, an estimated piecewise linearization can be used. This estimation is:

$$n = 16415 - INT\left(\frac{\text{Offset} - 1290}{32}\right) + BitOffset \quad \text{Equation 2}$$

Where, in one embodiment:

$200 \leqq \text{offset} \leqq 4000$

BitOffset=3, offset<767

2,767≦offset≦1403

1,1404≦offset≦2105

0,2106≦offset≦2777

−1,2778≦offset≦3417

−2, offset>3417

The approximation provided by Equation 2 yields a value for n and a fifth cycle 105 count value that provides a maximum error range of about −7.91 ppm to about +7.93 ppm for all offsets in the domain in one embodiment of the invention. The maximum error from granularity of the high speed oscillator is about 0.25 ppm because the synchronization is based on 4,000,000 counts. This brings the total low-speed compensated error to −8.16 ppm to +8.18 ppm, which is within the budgeted error for both fixed and mobile/handheld system embodiments in this example (refer to TABLE 1 above).

Endpoint device 10 can maintain synchronization using the nominal fifth cycle 105 count value of 16,384, or can compensate for error in the low-speed clock of RTC 28 by adjusting fifth cycle 105 to the calculated n value as determined by high-speed counter 29, according to one embodiment of the invention. The dual source RTC synchronization system and method of synchronizing an AMR system utilizing the system as described herein thereby provide periodic synchronization to maintain time accuracy system wide while minimizing power consumption and component cost.

Figure 3:
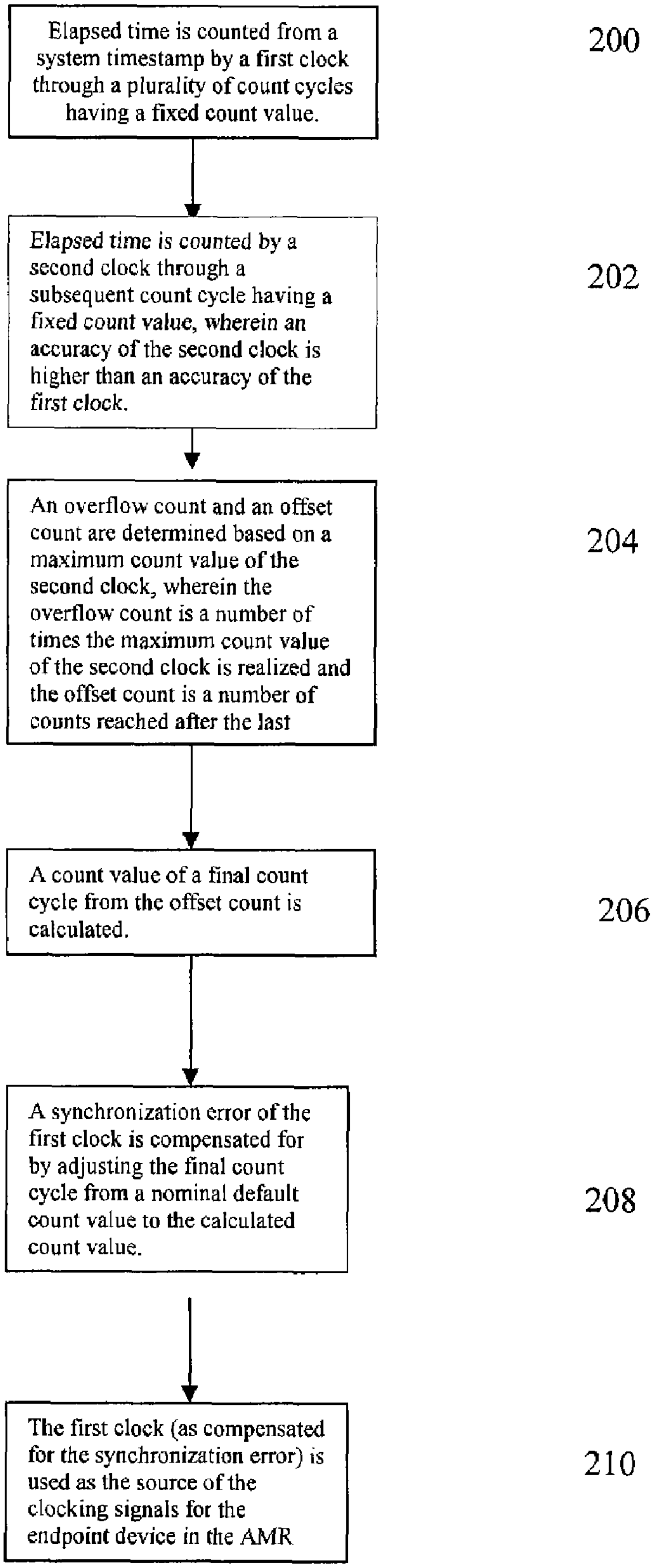
FIG. 3 is flow chart showing a method of synchronizing an endpoint device according to one embodiment of the invention.

As shown in FIG. 3, the invention includes a method of synchronizing an endpoint device adapted for radio frequency (RF) communications in an automatic meter reading (AMR) system. According to one embodiment of the method, the steps include step 200 where elapsed time is counted from a system timestamp by a first clock through a plurality of count cycles having a fixed count value. At step 202, elapsed time is counted by a second clock through a subsequent count cycle having a fixed count value, wherein an accuracy of the second clock is higher than an accuracy of the first clock. At step 204, an overflow count and an offset count are determined based on a maximum count value of the second clock, wherein the overflow count is a number of times the maximum count value of the second clock is realized and the offset count is a number of counts reached after the last maximum count value. A count value of a final count cycle from the offset count is calculated at step 206. At step 208, a synchronization error of the first clock is then compensated for by adjusting the final count cycle from a nominal default count value to the calculated count value, and at step 210 the first clock (as compensated for the synchronization error) is used as the source of the clocking signals for the endpoint device in the AMR system.

The invention may be embodied in other specific forms without departing from the spirit of the essential attributes thereof; therefore the illustrated embodiment should be considered in all respects as illustrative and not restrictive, reference being made to the appended claims rather than to the foregoing description to indicate the scope of the invention.

What is claimed is:

1. A method of synchronizing an endpoint device adapted for radio frequency (RF) communications in an automatic meter reading (AMR) system, the method comprising the steps of:

counting elapsed time from a system timestamp by a first clock through a plurality of count cycles having a fixed count value;

counting elapsed time by a second clock through a subsequent count cycle having a fixed count value, wherein an accuracy of the second clock is higher than an accuracy of the first clock;

determining an overflow count and an offset count based on a maximum count value of the second clock, wherein the maximum count value resets when reached and the overflow count equals the number of times the maximum count value of the second clock has been reached and the offset count equals number of counts reached after the last maximum count value;

calculating a calculated count value of a final count cycle from the offset count;

compensating for a synchronization error of the first clock by adjusting the final count cycle from a nominal default count value to the calculated count value; and using the first clock as compensated for the synchronization error as a source of clocking signals for the endpoint device in the AMR system.

2. The method of claim 1, wherein the calculated count value of the final count cycle is calculated using an estimated piecewise linearization method.

3. The method of claim 1, wherein the step of counting elapsed time from a system time stamp by a first clock further comprises counting through three count cycles having a first fixed count value.

4. The method of claim 3, wherein the step of counting elapsed time by a second clock further comprises counting though a fourth count cycle having a second fixed count value, and wherein the nominal default count value is the second fixed count value.

5. The method of claim 4, wherein the three count cycles each comprise about one second and the fourth and final count cycles each comprise about one-half second.

6. The method of claim 5, wherein the first fixed count value is 32,767 and the second fixed count value and the nominal default count value are each 16,384.

7. The method of claim 1, wherein the steps are performed during a periodic read of the endpoint device as part of the AMR system.

8. A utility meter endpoint device adapted for a radio frequency (RF) communication automatic meter reading (AMR) system, the utility meter endpoint device comprising:

a communications unit operatively coupled to a utility meter and comprising communications circuitry adapted for periodic RF communications with a reader; and a microcontroller comprising a real time clock (RTC) and a counter and electrically coupled to a power source and the communications circuitry, the RTC comprising a first oscillator and the counter comprising a second oscillator, the second oscillator having a higher accuracy than the first oscillator, wherein the microcontroller is operable to calculate an adjustable final count cycle based on the counter and the second oscillator after a plurality of fixed count cycles during a periodic RF communication and use the calculated adjustable final count cycle to compensate the RTC to maintain synchronization at an accuracy better than an accuracy of the first oscillator.

9. The device of claim 8, wherein the power source is common to the utility meter and electrically coupled to the communications unit.

10. The device of claim 8, wherein the reader is selected from the set consisting of a fixed network reader, a mobile reader, and a handheld reader.

11. The device of claim 8, wherein the plurality of fixed count cycles comprise first, second, third, and fourth count cycles, the first, second, and third count cycles having a first fixed count value and the fourth count cycle having a second fixed count value.

12. The device of claim 11, wherein the adjustable final count cycle has a nominal count value equal to the second fixed count value.

13. The device of claim 11, wherein the counter has a maximum count value and is operable to count during the fourth count cycle to determine an offset value used by the microcontroller to calculate the adjustable final count cycle, wherein an offset value is a counter value at the end of the fourth count cycle.

14. The device of claim 8, wherein the adjustable final count cycle is calculated by the microcontroller using an estimated piecewise linearization method.

15. The device of claim 8, wherein the second oscillator is used by the communications circuitry and is wirelessly synchronized to an external reference time signal.

16. A synchronization system for an endpoint device adapted for radio frequency (RF) communications in an automatic meter reading (AMR) system, the synchronization system comprising:

a microcontroller;

a first oscillator in operable communication with the microcontroller; and a second oscillator in operable communication with the microcontroller, the second oscillator wirelessly synchronizable with an external reference time signal and having a higher speed and a higher accuracy than the first oscillator, wherein the microcontroller operably determines an offset count value of the second oscillator during a fixed count cycle and synchronizes the first oscillator to the second oscillator during an RF communication by calculating an adjustable final count cycle from the offset count value.

17. The system of claim 16, wherein the AMR system is a mobile system.

18. The system of claim 17, wherein the synchronization system provides less than about two minutes error per month.

19. The system of claim 18, wherein the mobile system is a handheld system.

20. The system of claim 16, wherein the AMR system is a fixed network system.

21. The system of claim 20, wherein the synchronization system provides less than about ten milliseconds of drift in a period of five minutes.

* * * * *

UNITED STATES PATENT AND TRADEMARK OFFICE

CERTIFICATE OF CORRECTION

PATENT NO. : 7,343,255 B2

APPLICATION NO. : 11/176937

DATED : March 11, 2008

INVENTOR(S) : Christopher Osterloh and Christopher Nagy

It is certified that error appears in the above-identified patent and that said Letters Patent is hereby corrected as shown below:

Column 5, line 18, please delete “AMP” and insert in its place --AMR.--

Column 5, line 35, please delete “AIVIR” and insert in its place --AMR.--

Column 8, line 8, please delete “20.”

Signed and Sealed this

Sixth Day of January, 2009

JON W. DUDAS

*Director of the United States Patent and Trademark Office*